United States Patent
Liu et al.

(10) Patent No.: US 8,481,386 B2
(45) Date of Patent: Jul. 9, 2013

(54) NANOCRYSTAL MEMORIES AND METHODS OF FORMING THE SAME

(75) Inventors: Jianlin Liu, Riverside, CA (US); Dengtao Zhao, Santa Clara, CA (US); Yan Zhu, Santa Clara, CA (US); Ruigang Li, Fremont, CA (US); Bei Li, Fremont, CA (US)

(73) Assignee: The Regents of the University of California, Oakland, CA (US)

( * ) Notice: Subject to any disclaimer, the term of this patent is extended or adjusted under 35 U.S.C. 154(b) by 382 days.

(21) Appl. No.: 12/757,812

(22) Filed: Apr. 9, 2010

(65) Prior Publication Data

US 2010/0258851 A1    Oct. 14, 2010

Related U.S. Application Data

(60) Provisional application No. 61/168,163, filed on Apr. 9, 2009.

(51) Int. Cl.
*H01L 21/336* (2006.01)

(52) U.S. Cl.
USPC .... 438/257; 438/260; 257/316; 257/E21.209; 257/E29.03

(58) Field of Classification Search
None
See application file for complete search history.

(56) References Cited

U.S. PATENT DOCUMENTS

| | | | |
|---|---|---|---|
| 2007/0014151 A1* | 1/2007 | Zhang et al. | 365/185.01 |
| 2007/0029600 A1* | 2/2007 | Cohen | 257/315 |
| 2008/0099820 A1* | 5/2008 | Coppard et al. | 257/316 |

OTHER PUBLICATIONS

Tiwari et al., *A silicon nanocrystals based memroy*, Applied Physics Letters, vol. 68, No. 10, Mar. 4, 1996, p. 1377-1379.
Tiwari et al., *Volatile and Non-Volatile Memories in Silicon with Nano-Crystal Storage*, IBM Research Division; T.J. Watson Research Center, p. 20.4.1-20.4.4.
Tiwari et al., *Single charge and confinement effects in nano-crystal memories*, Applied Physics Letters, vol. 69, No. 9, Aug. 26, 1996, p. 1232-1234.
Photopoulos et al., *Photoluminescence from nanocrystalline silicon in Si/SiO$_2$ superlattices*, Applied Physics Letters, vol. 76, No. 24, Jun. 12, 2000, p. 3588-3590.
Shi et al., *Effects of traps on charge storage characteristics in metal-oxide-semiconductor memory structures based on silicon nanocrystals*, Journal of Applied Physics, vol. 84, No. 4, Aug. 15, 1998, p. 2358-2360.
Kim et al., *Room Temperature Single Electron Effects in Si Quantum Dot Memory with Oxide-Nitride Tunneling Dielectrics*, Department of Electrical Engineering, p. 5.2.1-5.2.4.
Hinds et al., *Emission lifetime of polarizable charge stored in nanocrystalline Si based single-electron memory*, Journal of Applied Physics, vol. 90, No. 12, Dec. 15, 2001, p. 6402-6408.
Han et al., *Programming Characteristics of P-Channel Si Nano-Crystal Memory*, IEEE Electron Device Letters, vol. 21, No. 6, Jun. 2000, p. 313-315.

(Continued)

*Primary Examiner* — Michelle Mandala
*Assistant Examiner* — Shaka White
(74) *Attorney, Agent, or Firm* — Knobbe, Martens, Olson & Bear, LLP

(57) ABSTRACT

In one embodiment, a memory device includes a substrate, a tunneling oxide, a silicide nanocrystal floating gate, and a control oxide. The tunneling oxide is positioned upon a first surface of the substrate, the silicide nanocrystal floating gate is positioned upon the tunneling oxide, and the control oxide positioned upon the nanocrystal floating gate.

9 Claims, 8 Drawing Sheets

OTHER PUBLICATIONS

Han et al., *Characteristics of P-Channel Si Nano-Crystal Memory*, IEEE Transactions on Electron Devices, vol. 48, No. 5, May 2001, p. 874-879.

Lee et al., *Theoretical and Experimental Investigation of Si Nanocrystal Memory Device with $HfO_2$ High-k Tunneling Dielectric*, IEEE Transactions on Electron Devices, vol. 50, No. 10, Oct. 2003, p. 2067-2072.

De Salvo et al., *How far will Silicon nanocrystals push the scaling limits of NVMs technologies?*, CEA-LETI, p. 26.1.1-26.1.4.

Monzio Compagnoni et al., *Program/erase dynamics and channel conduction in nanocrystal memories*, Dipartimento di Elettronica e Informazione, p. 22.4.1-22.4.4.

Baik et al., *High Speed and Nonvolatile Si Nanocrystal Memory for Scaled Flash Technology using Highly Field-Sensitive Tunnel Barrier*, Process Development Team, Memory Division, Device Solution Network, Samsung Electronics Co., Ltd., p. 22.3.1-22.3.4.

Kim et al., *Scaling of Nanocrystal Memory Cell by Direct Tungsten Bitline on Self-Aligned Landing Plug Polysilicon Contact*, IEEE Electron Device Letters, vol. 25, No. 5, May 2004, p. 265-267.

Crupi et al., *Peculiar Aspects of Nanocrystal Memory Cells: Data and Extrapolations*, IEEE Transactions on Nanotechnology, vol. 2, No. 4, Dec. 2003, p. 319-323.

Muralidhar et al., *A 6V Embedded 90nm Silicon Nanocrystal Nonvolatile Memory*, DigitalDNA Laboratories and the embedded Memory Center, p. 26.2.1-26.2.4.

Hanafi et al., *Fast and Long Retention-Time Nano-Crystal Memory*, IEEE Transactions on Electron Devices, vol. 43, No. 9, Sep. 9, 1996, p. 1553-1558.

Nakajima et al., *Formation of Sn nanocrystals in thin $SiO_2$ film using low-energy ion implantation*, Applied Physics Letters, vol. 71, No. 25, Dec. 22, 1997, p. 3652-3654.

Borany et al., *Ion Beam Synthesis of narrow Ge nanocluster bands in thin $SiO_2$ films*, Microelectronic Engineering, vol. 48, 1999, p. 231-234.

Normand et al., *Formation of 2-D arrays of semiconductor nanocrystals or semiconductor-rich nanolavers by very low-energy Si or Ge ion implantation in silicon oxide films*, Nuclear Instruments and Methods in Physics Research B, vol. 178, 2001, p. 74-77.

Meldrum et al., *Nanocomposite materials Formed by Ion Implantation*, Advanced Material, vol. 13, No. 19, Oct. 2, 2001, p. 1431-1444.

Kapetanakis et al., *Room-temperature single-electron charging phenomena in large-area nanocrystal memory obtained by low-energy ion beam synthesis*, Applied Physics Letters, vol. 80, No. 15, Apr. 15, 2002, p. 2794-2796.

González-Varona et al., *Control of tunnel oxide thickness in Si-nanocrystal array memories obtained by ion implantation and its impact in writing speed and volatility*, Applied Physics Letters, vol. 82, No. 13, Mar. 13, 2003, p. 2151-2153.

Normand et al., *Nanocrystals manufacturing by ultra-low-energy ion-beam-synthesis for non-volatile memory applications*, Nuclear Instruments and Methods in Physics Research B, vol. 216, 2004, p. 228-238.

Maeda et al., *Electrical properties of Si nanocrystals embedded in an ultrathin oxide*, Nanotechnology, vol. 10, 1999, p. 127-131.

Kim et al., *Ultralarge capacitance-voltage hysteresis and charge retention characteristics in metal oxide semiconductor structure containing nanocrystals deposited by ion-beam-assisted electron beam deposition*, Applied Physics Letters, vol. 78, No. 7, Feb. 12, 2001, p. 934-936.

Choi et al., *Observation of memory effect in germanium nanocrystals embedded in an amorphous silicon oxide matrix of a metal-insulator-semiconductor structure*, Applied Physics Letters, vol. 80, No. 11, Mar. 18, 2002, p. 2014-2016.

Kanjilal et al., *Structural and electrical properties of silicon dioxide layers with embedded germanium nanocrystals grown by molecular beam epitaxy*, Applied Physics Letters, vol. 82, No. 8, Feb. 24, 2003, p. 1212-1214.

Ostraat et al., *Synthesis and characterization of aerosol silicon nanocrystal nonvolatile floating-gate memory devices*, Applied Physics Letters, vol. 79, No. 3, Jul. 16, 2001, p. 433-435.

Liu et al., *Metal Nanocrystal Memories—Part I: Device Design and Fabrication*, IEEE Transactions on Electron Devices, vol. 49, No. 9, Sep. 2002, p. 1606-1613.

Liu et al., *Metal Nanocrystal Memories—Part II: Electrical Characteristics*, IEEE Transactions on Electron Devices, vol. 49, No. 9, Sep. 2002, p. 1614-1622.

Liu et al., *A Novel Quad Source/Drain Metal Nanocrystal Memory Device for Multibit-Per-Cell Storage*, IEEE Electron Device Letters, vol. 24, No. 5, May 2003, p. 345-347.

Lee et al., *Operational and Reliability Comparison of Discrete-Storage Nonvolatile Memories: Advantages of Single- and Double-Layer Metal Nanocrystals*, School of Electrical and Computer Engineering, Cornell University, p. 22.6.1-22.6.4.

Takata et al., *New Non-Volatile Memory with Extremely High Denisty Metal Nano-Dots*, Department of Bioengineering and Robotics, Tohoku University, p. 22.5.1-22.5.4.

King et al., *MOS Memory Using Germanium Nanocwstals Formed by Thermal Oxidation of $Si_{1-x}Ge_x$*, Department of Electrical Engineering and Computer Science, University of California at Berkeley, p. 5.3.1-5.3.4.

Yoon et al., *High spatial density nanocrystal formation using thin layer of amorphous $Si_{0.7}Ge_{0.3}$ deposited on $SiO_2$*, Journal of Applied Physics, vol. 87, No. 5, Mar. 1, 2000, p. 2449-2453.

Li et al., *Capacitance and conductance characterization of ferrocene-containing self-assembled monolayers on silicon surfaces for memory applications*, Applied Physics Letters, vol. 81, No. 8, Aug. 19, 2002, p. 1494-1496.

Gowda et al., *Hybrid Silicon/Molecular Memories: Co-Engineering for Novel Functionality*, Department of Electrical and Computer Engineering, North Carolina State University, p. 22.1.1-22.1.4.

Shi et al., *Tunneling Leakage Current in Ultrathin (<4 nm) Nitride/Oxide Stack Dielectrics*, IEEE Electron Device Letters, vol. 19, No. 10, Oct. 1998, p. 388-390.

Shi et al., *Electrical Properties of High-Quality Ultrathin Nitride/Oxide Stack Dielectrics*, IEEE Transactions on Electron Devices, vol. 46, No. 2, Feb. 1999, p. 362-368.

Likharev et al., *Layered tunnel barriers for nonvolatile memory devices*, Applied Physics Letters, vol. 73, No. 15, Oct. 12, 1998, p. 2137-2139.

Casperson et al., *Material issues for layered tunnel barrier structures*, Journal of Applied Physics, vol. 92, No. 1, Jul. 1, 2002, p. 261-267.

Chang et al., *Quasisuperlattice storage: A concept of multilevel charge storage*, Applied Physics Letters, vol. 85, No. 2, Jul. 12, 2004, p. 248-250.

Wagner et al., *Vapor-Liquid-Solid Mechanism of Single Crystal Growth*, Applied Physics Letters, vol. 4, No. 5, Mar. 1, 1964, p. 89-90.

Morales et al., *A Laser Ablation Method for the Synthesis of Crystalline Semiconductor Nanowires*, Science, vol. 279, Jan. 9, 1998, p. 208-211.

Duan et al., *Synthesis and optical properties of gallium arsenide nanowires*, Applied Physics Letters, vol. 76, No. 9, Feb. 28, 2000, p. 1116-1118.

Gudiksen et al., *Diameter-Selective Synthesis of Semiconductor Nanowires*, Journal of the American Chemical Society, vol. 122, 2000, p. 8801-8802.

Ohlsson et al., *Growth and characterization of GaAs and InAs nanowhiskers and InAs/GaAs heterostructures*, Physica E, vol. 13, 2002, p. 1126-1130.

Stach et al., *Watching GaN Nanowires Grow*, Nano Letters, vol. 3, No. 6, 2003, 867-869.

Law et al., *Semiconductor Nanowires and Nanotubes*, Annual Review of Materials Research, vol. 34, 2004, p. 83-126.

Iijima, *Helical microtubules of graphic carbon*, Nature, vol. 354, Nov. 7, 1991, p. 56-58.

Guo et al., *A Silicon Single-Electron Transistor Memory Operating at Room Temperature*, Science, vol. 275, Jan. 31, 1997, p. 649-651.

Welser et al., *Room Temperature Operation of a Quantum-Dot Flash Memory*, IEEE Electron Device Letters, vol. 18, No. 6, Jun. 1997, p. 278-280.

Shi et al., *Effects of traps on charge storage characteristics in metal-oxide-semiconductor memory structures based on silicon nanocrystals*, Journal of Applied Physics, vol. 84, No. 4, Aug. 15, 1998, p. 1258-2360.

Yano et al., *Single-Electron Memory for Giga-to Tera Bit Storage*, Proceedings of the IEEE, vol. 87, No. 4, Apr. 1999, p. 633-651.

Yang et al., *Nonvolatile memory based on Ge/Si hetero-nanocrystals*, Applied Surface Science, vol. 224, 2004, p. 394-398.

Koh et al., *Self-aligned $TiSi_2$ for bipolar applications*, The Journal of Vacuum Science and Technology B, vol. 3, No. 6, Nov./Dec. 1985, p. 1715-1724.

Woods et al., *Self-aligned cobalt disilicide/silicon Schottky barrier contacts: fabrication, materials and electrical characterization*, Semiconductor Science and Technology, vol. 11, 1996, p. 1103-1115.

Wong et al., *Nanoscale CMOS*, Proceedings of the IEEE, vol. 87, No. 4, Apr. 1999, p. 537-570.

Tiwari et al., *Volatile and Non-Volatile Memories in Silicon with Nano-Crystal Storage*, T.J. Watson Research Center, p. 20.4-1-20.4.4, Dec. 1995.

Zhu et al., *Fabricatioin and characterization of $TiSi_2$ heteronanocrystal metal-oxide-semiconductor memories*, Journal of Applied Physics 101, 063702 (2007), p. 063702-063702-4.

Zhu et al., *Self-aligned $TiSi_2$/Si heteronanocrystal nonvolatile memory*, Applied Physics Letters 88, 103507 (2006), p. 103507-103507-3.

Zhu et al., *$TiSi_2$/Si heteronanocrystal metal-oxide-semiconductor-field-effect-transistor memory*, Applied Physics Letters 89, 103507 (2006), p. 233113-233113-3.

Zhu et al., *A $TiSi_2$/Si Heteronanocrystal Memory Operated With Hot Carrier Injectors*, IEEE Transactions on Nanotechnology, vol. 7, No. 3, May 2008, p. 305-307.

\* cited by examiner

Programming

Flat Band

Retention

Erasing

NANOCRYSTAL MEMORIES AND METHODS OF FORMING THE SAME

CROSS-REFERENCE TO RELATED APPLICATIONS

This application claims the benefit of priority under 35 U.S.C. §119(e) of U.S. Provisional Application No. 61/168,163, filed on Apr. 9, 2009 and entitled, "NOVEL NANOCRYSTAL MEMORIES," the entirety of which is incorporated herein by reference.

STATEMENT REGARDING FEDERALLY SPONSORED R&D

This invention was made with government funds under Contract No. Hr0011-07-3-0002 awarded by DARPA. The U.S. Government has rights in this invention.

BACKGROUND

1. Field

Embodiments of the invention relate to memories, and more particularly, to nanocrystal memories.

2. Description of the Related Technology

Nanocrystal memory devices can retain stored information, even when not receiving power. The retention time, programming speed, and erase speed of a nanocrystal memory device can be important design parameters. Reducing the tunnel oxide thickness of a nanocrystal memory device permits integration of nanocrystal memories with scaled-down CMOS platforms. However, a thin tunnel oxide can degrade the retention time of the nanocrystal memory device.

Prior efforts to scale down nanocrystal memory devices have included the use of floating metal nanocrystals, floating Ge nanocrystals, Ge/Si hetero-nanocrystals and porphyrin molecules as charge storage nodes. Other approaches have considered multi-layered dielectrics, including, for example, crested multilayer tunneling barriers and the use of nitride/oxide layered structures to replace a single oxide tunneling barrier. In a further example, quasi-superlattices have been reported, wherein multilevel storage is realized by using a $Si/Si_3N_4$ superlattice.

Conventional approaches have required the use of complex fabrication processes, careful material selection, and/or additional masking steps, as compared with a standard Si CMOS process. Moreover, the tradeoffs that exist between extended duration retention and slower programming and erasure speed have not been completely removed.

There is a need for improved nanocrystal memories and methods of forming the same. Moreover, there is a need for nanocrystal memory devices which are compatible with existing Si VLSI processes, and which can function as both p-channel and n-channel memories.

SUMMARY

DETAILED DESCRIPTION

In embodiments of the present disclosure, nanocrystalline memory systems and methods of fabrication are disclosed. In certain embodiments, the nanocrystalline memory systems employ silicide/silicon hetero-nanocrystals as floating gates. The silicide can be a metallic silicide, such as, for example, $TiSi_2$, $CoSi_2$, $NiSi$, $NiSi_2$, $MnSi_2$, $CrSi_2$, $MoSi_2$, $TaSi_2$, $PtSi$, and $WSi$. The hetero-nanocrystals can be formed, for example, by vapor-liquid-solid (VLS) or vapor-solid-solid (VSS) growth mechanisms. Skilled artisan will appreciate that VLS/VSS growth can include providing a catalyst nanocrystal at an elevated temperature, and growing the nanocrystal by absorbing silicon from a silicon-contained vapor, such as silane ($SiH_4$), disilane ($Si_2H_6$), etc. However, other techniques can be used to develop silicon nanocrystals, including low pressure chemical vapor deposition (LPCVD), ion implantation and subsequent high-temperature annealing, thermal oxidation of amorphous silicon film, co-sputtering of $SiO_2$ and silicon, molecular beam epitaxy and subsequent rapid thermal processing, and aerosol deposition.

In other embodiments, the nanocrystalline memory systems can utilize metallic silicide nanocrystals as floating gates. Examples of the metallic silicides include, but are not limited to, $TiSi_2$, $CoSi_2$, $NiSi$, $NiSi_2$, $MnSi_2$, $CrSi_2$, $MoSi_2$, $TaSi_2$, $PtSi$, and $WSi$. Skilled artisans will appreciate that metallic silicides can function similarly to metals in certain aspects, and can exhibit a high density of states around Fermi level. The high density of states of metallic silicides can make the silicides less prone to defect induced traps or quantum confinement effects, thereby permitting substantially uniform programming, erasing, and retention characteristics. Certain silicides, such as, for example, titanium silicide, cobalt silicide, nickel silicide and platinum silicide, can be formed either by VLS/VSS growth method or by self-aligned silicidation formation processes, and can have a valence band edge ($E_v$) and a conduction band edge ($E_c$) lower than that of Si. Thus, certain metallic silicide nanocrystals can be used for both p-channel and n-channel memories, which can aid in providing compatibility with existing Si VLSI processes.

Figure 1:
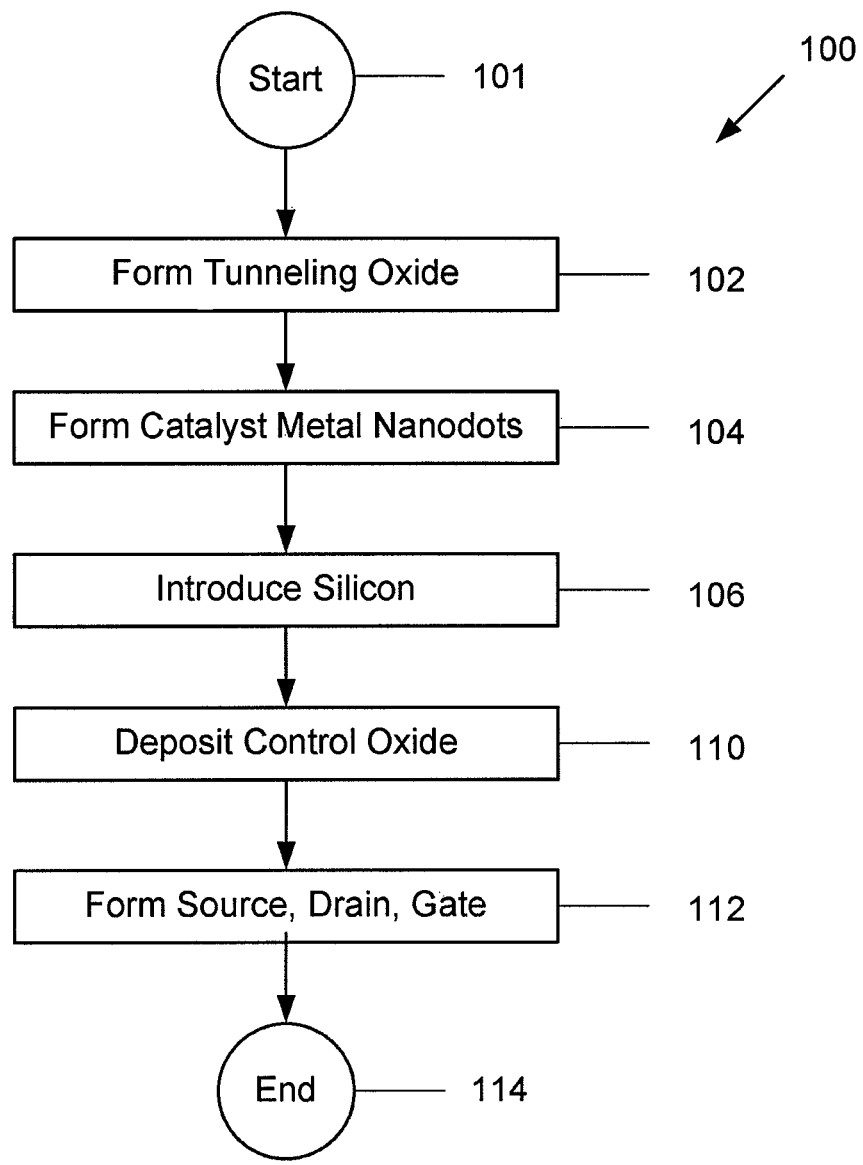
FIG. 1 is a flow diagram of a method for forming a memory device in accordance with one embodiment.

FIG. 1 is a flow diagram of a method 100 for forming a memory device in accordance with one embodiment. FIGS. 2A-2D are schematic cross sections illustrating the method 100 of FIG. 1. It will be understood that the methods discussed herein may include greater or fewer operations and the operations may be performed in any order, as necessary. The illustrated method can be used to manufacture, for example, the memory devices illustrated in FIG. 3 and FIG. 4.

Figure 2C:
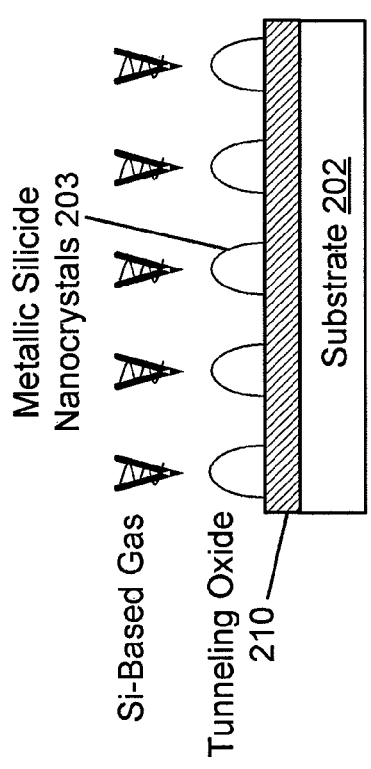
FIGS. 2A-2D are schematic cross sections illustrating the method of FIG. 1.
Figure 2D:
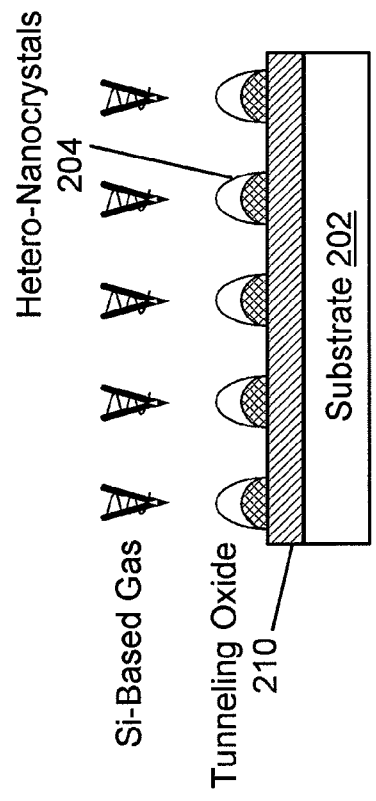
Figure 2A:
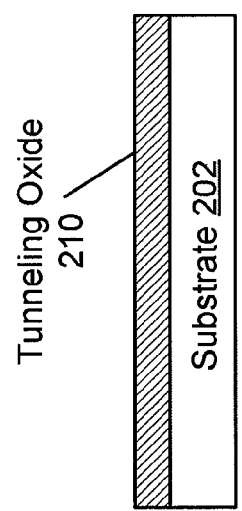

With reference to FIG. 1 and FIGS. 2A-2D, the method 100 for fabricating silicide nanocrystal memory and silicide/Si hetero-nanocrystal memory devices using vapor-liquid-solid (VLS) or vapor-solid-solid (VSS) growth starts at 101. In an ensuing block 102, the tunneling oxide 210 is formed upon a substrate 202 (FIG. 2A). In one embodiment, the substrate 202 comprises Si in a (100) orientation and the tunneling oxide 210 comprises $SiO_2$. The tunneling oxide can be formed utilizing a variety of fabrication techniques, including, but not limited to, thermal oxidation. The tunneling oxide 210 can have, for example, a thickness ranging between about 2 nm to about 7 nm.

Figure 2B:
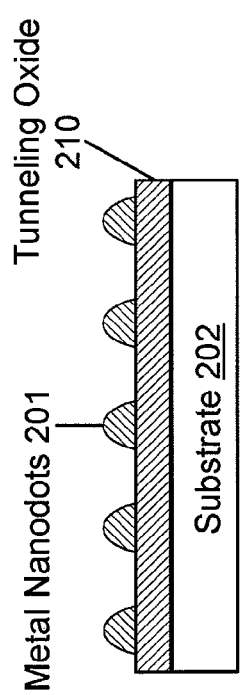

The method 100 continues at a block 104, in which nanodots 201 of a catalyst metal are formed on the tunneling oxide 210 (FIG. 2B). In one embodiment, the catalyst metal nanodots 201 are formed by self-assembly. For example, a catalyst metal, such as titanium, nickel, or platinum, can be deposited on the tunneling oxide 210 using, for example, e-beam evaporation, effusion cell, or sputtering. The substrate temperature can be selected from a temperature ranging between about 100° C. to about 750° C., and the deposited catalyst metal can self-assemble due to strain relaxation into metal nanodots 201. The metal nanodots 201 can have, for example, diameters ranging between about 2 nm to about 10 nm. In an alternative embodiment, the catalyst metal nanodots 201 are formed by first depositing a thin layer of the catalyst metal at a relatively low temperature, such as room temperature. Thereafter, the catalyst metal nanodots 201 can be formed by a thermal anneal. The layer of catalyst metal can have a thickness ranging between about 0.2 nm to about 2 nm. The thermal annealing can be performed at a temperature ranging between about 100° C. to about 750° C., and for a time ranging between about 30 seconds to about 15 minutes.

The catalyst metal can be selected based on a variety of factors. For example, the catalyst metal can be selected based upon the metal's ability to enhance subsequent silicon dot growth, the low diffusivity or solubility of the catalyst metal in the tunneling oxide 210, and/or the Fermi level of the catalyst metal relative to middle of the forbidden gap of silicon. The catalyst metal can include, for example, platinum, nickel, titanium, cobalt, magnesium, chromium, molybdenum, tantalum, platinum, and tungsten.

The method 100 continues at a block 106, in which silicon is introduced into the chamber (FIG. 2C and FIG. 2D). Introducing silicon into the chamber can include providing a silicon-based gas. In one embodiment, the silicon-based gas includes disilane, $Si_2H_6$, and is introduced at a temperature ranging between about 100° C. to about 750° C. However, persons of ordinary skill in the art will appreciate that a variety of silicon-based gases can be employed, including, for example, $SiH_4$ and $SiH_2Cl_2$.

The silicon-based gas can be introduced while maintaining growth pressure. For example, growth pressure can be maintained at a pressure ranging between about 0.01 mtorr and about 1000 mtorr, and for a time ranging between about 15 seconds to about 15 minutes. During this time, silicon from the disilane or other silicon containing gas can be absorbed into the metal nanodots 201. The growth time can be selected to be relatively short such that silicide nanocrystals 203 are formed, as shown in FIG. 2C. However, growth time can be extended such that silicide/Si hetero-nanocrystals 204 are formed. Silicide nanodots can be formed after silicon is absorbed into the metal nanodots 201. For hetero-nanocrystal formation, silicon can be grown between $SiO_2$ tunneling oxide and metallic silicide nanodots. The growth can be terminated by stopping the flow of the silicon containing gas.

Skilled artisans will appreciate that the absorption of Si atoms into the metal nanodots can create silicide nanodots (FIG. 2C) and that further absorption of Si can lead to the formation of a Si layer underneath the silicide, thereby forming silicide/Si hetero-nanocrystals (FIG. 2D). The resulting silicide nanocrystal memory and/or silicide/Si hetero-nanocrystal memory device can offer enhanced thermal stability relative to a memory device having only metal nanodots. Additionally, a memory device employing silicide/Si heteronanocrystals can have improved retention time relative to a memory device employing metal nanodots only, since the additional silicon nanocrystal can provide an additional energy barrier for charges. Furthermore, a memory device having silicide nanocrystals or silicide/Si hetero-nanocrystals can enhance device endurance characteristics by minimizing the segregation of metal atoms into the tunneling oxide 210 over many writing and erasing cycles, as compared with a memory device having only metal nanodots.

The method 100 continues to a block 110, in which the sample is removed from the process chamber and a control oxide is deposited. The control oxide can be deposited, for example, by a low pressure chemical vapor deposition or a variety of other fabrication techniques. In an ensuing block 112, subsequent MOSFET processing, such as the formation of a gate, source, drain, and other features of the memory device, can be performed. The process ends at a block 114.

As described above, the method 100 can be employed to produce silicide/silicon hetero-nanocrystals 204. Thus, the method 100 can be used to fabricate a memory device having silicide/Si hetero-nanocrystals, such as the memory device of FIG. 4 described below. However, skilled artisans will appreciate that the method 100 can be used to fabricate heteronanocrystals 204 having other metal-silicon compositions. For example, the vapor-liquid-solid or vapor-solid-solid process, i.e., the absorption of silicon atoms into metal can be employed to produce not only metallic silicides, but other metal-silicon compounds. Thus, the method 100 can be utilized to produce metal-silicon eutectic/silicon hetero-nanocrystals. Additionally, the method 100 can be utilized to produce substantially pure metallic silicide nanocrystals. For example, the growth time and growth temperature can be selected such that metallic silicide nanodots are formed before forming silicide/Si hetero-nanocrystals. Thus, the method 100 can be employed to produce a memory device having a metallic silicide nanocrystal floating gate, such as the memory device of FIG. 3 described below.

Figure 3:
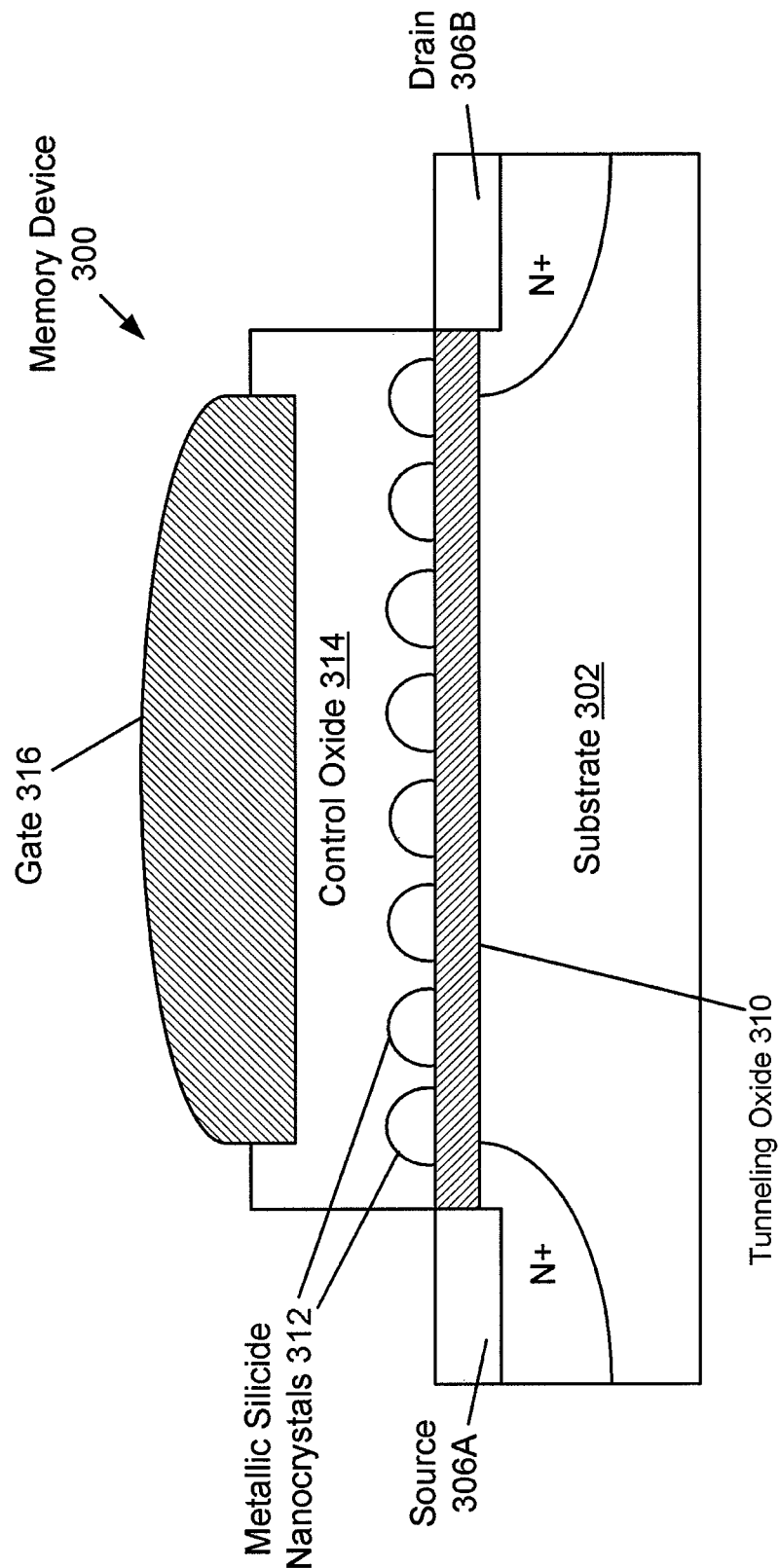
FIG. 3 is a cross section of a memory device in accordance with one embodiment.

FIG. 3 is a cross section of a memory device in accordance with one embodiment. The memory device 300 includes a substrate 302, a source 306A, a drain 306B, tunneling oxide 310, silicide nanocrystals 312, control oxide 314, and gate 316. As shown in FIG. 3, the tunneling oxide 310 is positioned between the substrate 302 and a plurality of electrically isolated nanocrystals 312. The control oxide 314 is positioned over the nanocrystals 312 and the tunneling oxide 310, and below the gate 316.

Each nanocrystal 312 can be a substantially pure metallic silicide nanocrystal or a Si-metal eutectic compound. In one embodiment, the metallic silicide includes $TiSi_2$. In another embodiment the metallic silicide includes $CoSi_2$, NiSi, $NiSi_2$, $MnSi_2$, $CrSi_2$, $MoSi_2$, $TaSi_2$, PtSi, or WSi.

In one embodiment, the silicide nanocrystals 312 have diameters ranging between about 2 nm to about 10 nm. The number of silicide nanocrystals 312 selected to form the floating gate of the memory device 300 can depend on a variety of factors, including, for example, the processing technology and the dimensions of the gate 316. In one embodiment, the silicide nanocrystals 312 have a dot density to exceed $8-9 \times 10^{11}$ cm$^{-2}$. In another embodiment, the metallic silicide 312 includes $TiSi_2$. In yet another embodiment, the metallic silicide 312 is selected from $CoSi_2$, NiSi, $NiSi_2$, $MnSi_2$, $CrSi_2$, $MoSi_2$, $TaSi_2$, PtSi, and WSi.

The tunneling oxide can include, for example, $SiO_2$, and can have, for example, a thickness ranging between about 2 nm to about 7 nm. The control oxide can include, for example, SiO$_2$, and can have, for example, a thickness ranging between about 10 nm to about 20 nm. The gate 316 can have, for example, a length ranging between about 16 nm to about 160 nm.

Figure 4:
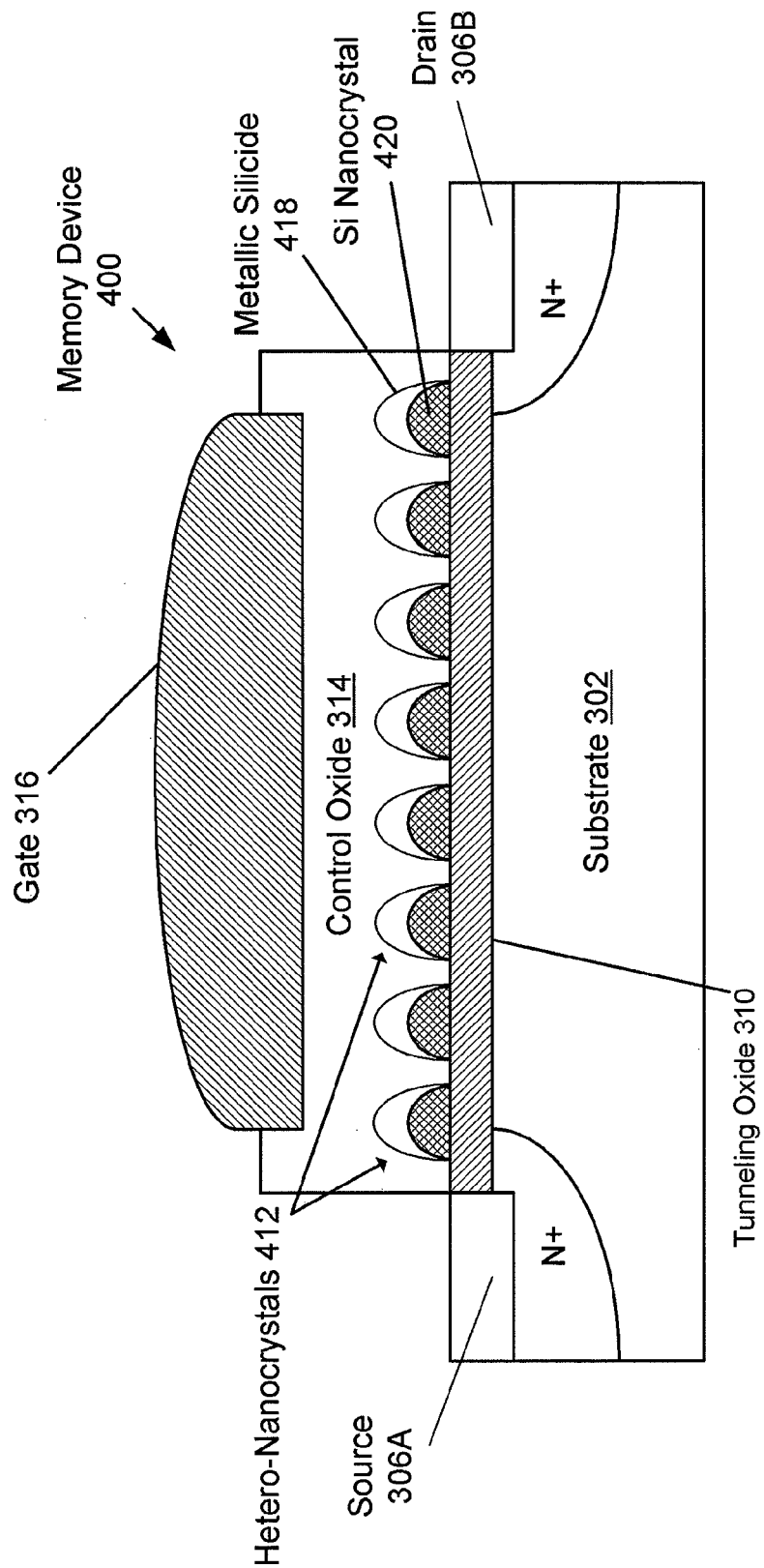
FIG. 4 is a cross section of a memory device in accordance with another embodiment.

FIG. 4 is a cross section of a memory device in accordance with another embodiment. The memory device 400 includes a substrate 302, a source 306A, a drain 306B, tunneling oxide 310, hetero-nanocrystals 412, control oxide 314, and gate 316. As shown in FIG. 4, the tunneling oxide 310 is positioned between the substrate 302 and a plurality of electrically isolated hetero-nanocrystals 412. The control oxide 314 is positioned over the nanocrystals 312 and the tunneling oxide 310, and below the gate 316.

Each hetero-nanocrystal 412 can include metallic silicide 418 and Si nanocrystal 420. In the illustrated embodiment, the metallic silicide 418 is positioned between the Si nanocrystals 420 and the control oxide 414 such that the metallic silicide 418 is positioned above the Si nanocrystal 420 and such that the metallic silicide 418 is not substantially touching the tunneling oxide 410. However, skilled artisans will appreciate that other configurations are arrangements of the Si nanocrystal 420 and the metallic silicide 418 can be employed.

In one embodiment, the hetero-nanocrystals 412 have diameters ranging between about 2 nm to about 10 nm. The number of hetero-nanocrystals selected to form the floating gate of the memory device 400 can depend on a variety of factors, including, for example, the processing technology and the dimensions of the gate. In one embodiment, the hetero-nanocrystals have a dot density to exceed $8$-$9\times10^{11}$ cm$^{-2}$. In one embodiment, the metallic silicide in hetero-nanocrystals includes TiSi$_2$. In another embodiment, the metallic silicide in hetero-nanocrystals is selected from CoSi$_2$, NiSi, NiSi$_2$, MnSi$_2$, CrSi$_2$, MoSi$_2$, TaSi$_2$, PtSi, and WSi.

Although FIGS. 3 and 4 are illustrated for the case of an n-channel memory device, persons of ordinary skill in the art will appreciate that metallic silicide nanocrystals and silicide/Si heteronanocrystals can be employed as a floating gate for a p-channel memory device. For example, certain silicides, such as titanium silicide, cobalt silicide, nickel silicide and platinum silicide, can have a valence band edge (E$_v$) and a conduction band edge (E$_c$) lower than that of Si, and thus can be utilized in both n-channel and p-channel memories.

The memory devices 300, 400 employ silicide nanocrystals and silicide/silicon hetero-nanocrystals as a floating gate, respectively. Charges can tunnel through the thin tunnel oxide, thereby permitting the accumulation of electrical charge on the floating gate. Employing a multitude of nanocrystals to form a floating gate can improve immunization to lateral charge migration and stress induced leakage current. Additionally, having discrete nanocrystals can reduce defects within the floating gate and dielectric layers, thereby improving charge retention performance. Thus, the tunnel oxide thickness and operation voltages can be selectively scaled downward, providing flexibility in design. The electrical isolation between silicide nanocrystals and hetero-nanocrystals permits a thin tunneling oxide, which can enable relatively fast programming and erasing speeds.

The memory devices 300, 400 can be fabricated by employing a variety of techniques and materials, including, for example, the techniques and materials described above with reference to FIG. 1 and FIG. 2. In certain embodiments to be described below, the memory devices 300, 400 can be fabricated in a conventional CMOS process without the addition of any photomasks.

Figure 5:
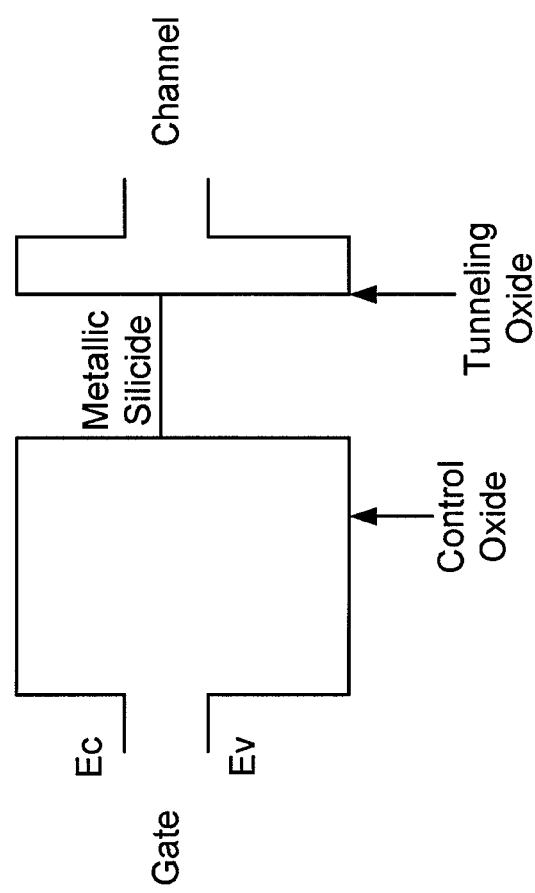
FIG. 5 is a band diagram illustrating one example of a memory device employing metallic silicide nanocrystals as a floating gate.

FIG. 5 is a band diagram illustrating one example of a memory device employing metallic silicide nanocrystals as a floating gate, such as the memory device 300 of FIG. 3. The band diagram illustrates the memory device under a flat band condition. As shown, the Fermi level of the metallic silicide is in the forbidden gap of silicon. Thus, the metallic silicide nanocrystal memory can include a deep potential well with oxide barriers, which can aid in providing substantially uniform channel erasing.

For a writing process, the electrons can be injected from the substrate 302 to the metallic silicide nanocrystals 312 via a tunneling process. The negative charges in the metallic silicide nanocrystals 312 can be released to the substrate 302 or substantially eliminated by the injection of positive charges from the substrate 302.

For an erasing process, the bottom of the control oxide/silicide/tunneling oxide quantum well is lower than the conduction band edge (E$_c$) of the substrate 302. Thus, the current component of the electron from the nanocrystals 312 to the substrate 302 can be relatively small and the erasing speed of the memory device can be similar to the writing speed.

Under both writing and erasing conditions, the electron transport can be related to the physical properties of silicide, for example, high density of states of the material. Thus, the programming and erase times can be shorter than that of a conventional memory device employing only silicon nanocrystals as a floating gate.

During a retention condition, the electrons in the nanocrystals 312 can be thermally excited to an energy level at least equal to about E$_c$ of the Si substrate 302 before tunneling back to the substrate 302. The two-step tunneling process can be associated with a much lower tunneling probability than single-step tunneling in a Si nanocrystal memory. Thus, a metallic silicide nanocrystal memory can have a much longer retention time than a Si nanocrystal memory.

FIG. 5 was described with reference to a memory device employing metallic silicide nanocrystals as a floating gate, such as the memory device 300 of FIG. 3. The band diagrams of the memory device 300 can be similar for embodiments having silicide nanocrystals made by processes such as those described above with reference to FIG. 1 and FIG. 2, or in other processes, such as those as discussed below with reference to FIG. 7 and FIG. 8, in which annealing can be used to convert silicon to silicide nanocrystals.

FIGS. 6A-6D are band diagrams for another example of a memory device, such as the memory device 400 of FIG. 4, employing a silicide/silicon hetero-nanocrystal floating gate under various biasing conditions.

Figure 6B:
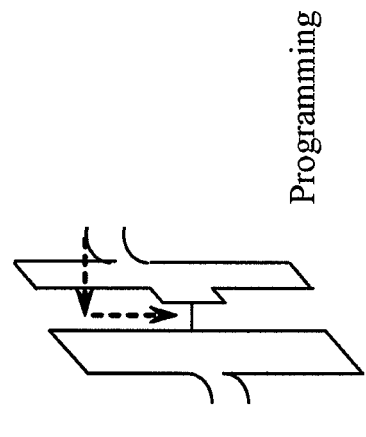
FIGS. 6A-6D are band diagrams for one example of a memory device employing silicide/silicon hetero-nanocrystals as a floating gate under various biasing conditions.
Figure 6A:
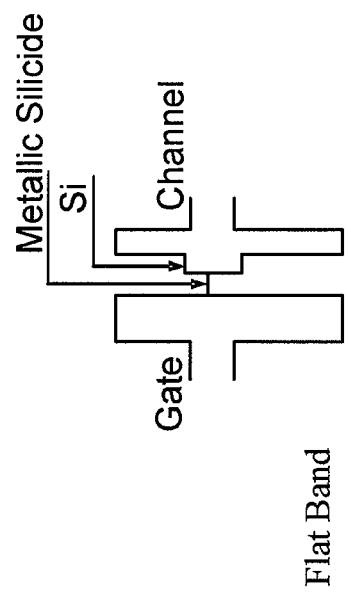

FIG. 6A illustrates a band diagram of the memory device under a flat band condition. As shown, the Fermi level of the metallic silicide is in the forbidden gap of silicon. Thus, the silicide/Si hetero-nanocrystal memories can include a deep potential well with oxide barriers, which can aid in providing substantially uniform channel erasing. Additionally, drain to floating gate coupling can be substantially eliminated, which can permit the use of shorter channel lengths and higher drain voltages during readout.

FIG. 6B illustrates a band diagram of the memory device under a programming condition. During writing or programming of the memory device, the injection of electrons occurs from the channel to the hetero-nanocrystal via channel hot electron injection (CHEI), Fowler-Nordheim (F-N) tunneling, and/or direct tunneling. The wave functions of the electrons can be localized primarily in the metallic silicide nanocrystals, which can act as a potential well for carriers.

Figure 6D:
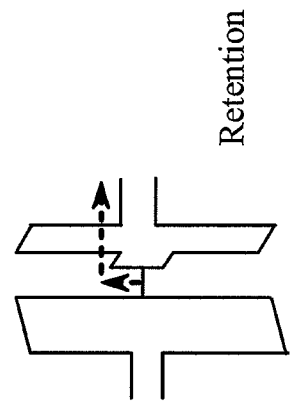
Figure 6C:
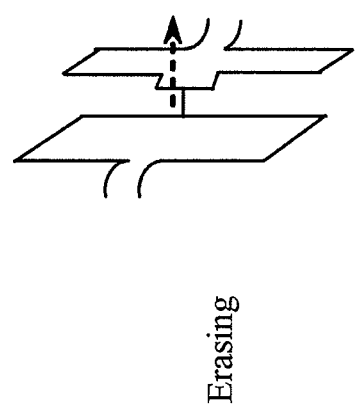

FIG. 6C illustrates a band diagram of the memory device under an erasing condition. During erasing, the electrons can be rejected back to the channel with negatively biased gate voltage (F-N erasing).

Under both writing and erasing conditions, the electron transport can be related to the physical properties of silicide, for example, high density of states of the material and also related to the additional barrier of silicon. The programming and erasing times can be shorter than that of a conventional memory device employing only silicon nanocrystals as a floating gate.

FIG. 6D illustrates a band diagram of the memory device under a retention condition. In contrast to conventional memory devices employing silicon nanocrystals as a floating gate, the confined electrons must cross two potential barriers. The conduction band offset between metallic silicide and silicon and the tunneling oxide barrier can prolong the retention time compared to that of a memory device utilizing a silicon nanocrystal floating gate. Thus, for a particular retention time, the tunnel oxide of a memory device employing silicide/Si hetero-nanocrystals as a floating gate can be less than that of a memory device employing only Si nanocrystals as a floating gate. This permits silicide/Si hetero-nanocrystal memories to be smaller than Si nanocrystal memories for a particular retention time.

Figure 7:
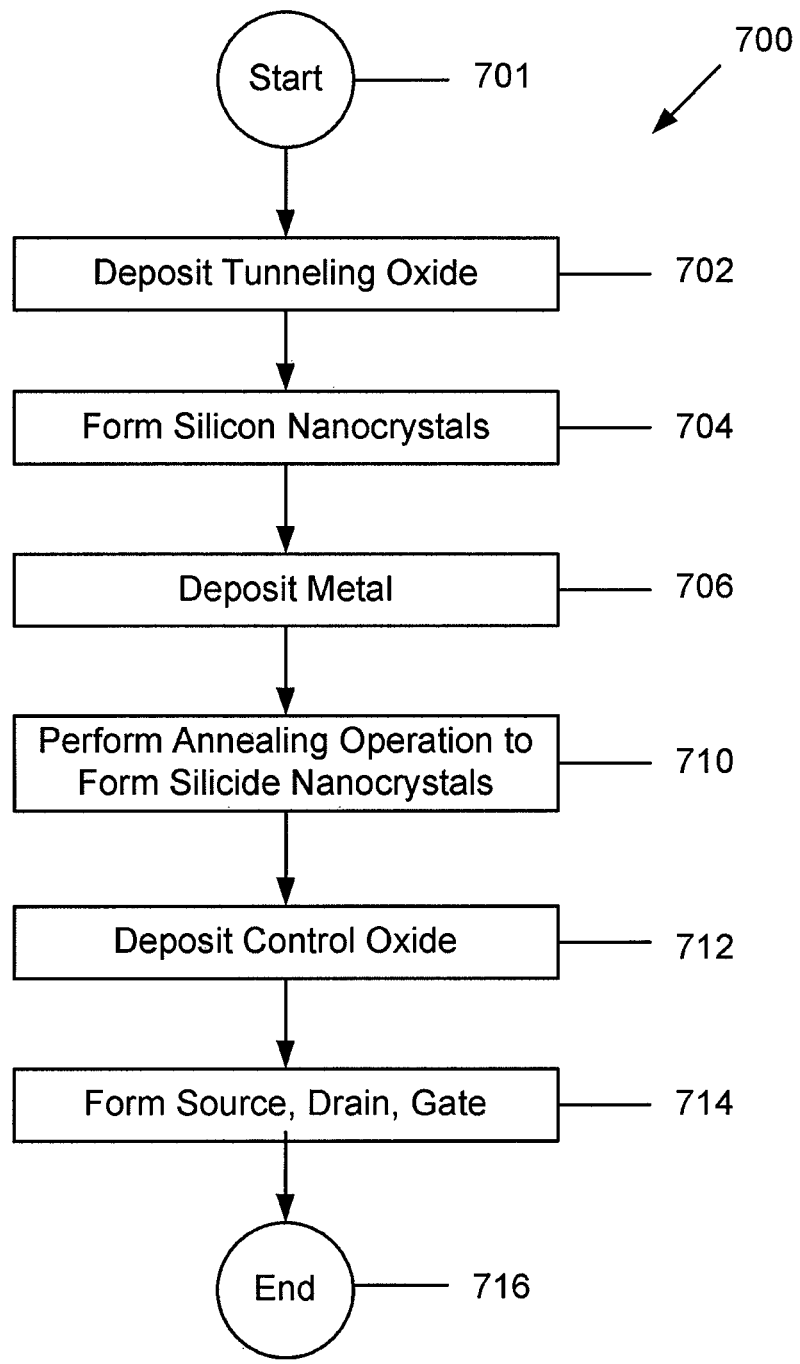
FIG. 7 is flow diagram of a method for forming a memory device in accordance with another embodiment.

FIG. 7 is a flow diagram of a method 700 for forming a memory device in accordance with yet another embodiment. It will be understood that the methods discussed herein may include greater or fewer operations and the operations may be performed in any order, as necessary. The illustrated method can be used to manufacture, for example, the memory device 300 illustrated in FIG. 3.

The method 700 for fabricating metallic silicide nanocrystal memory devices starts at 701. In an ensuing block 702, the tunneling oxide 310 is formed upon a substrate 302. In one embodiment, the substrate 302 comprises Si in a (100) orientation and the tunneling oxide 310 comprises $SiO_2$. The tunneling oxide 310 can be formed utilizing a variety of fabrication techniques, including, but not limited to, thermal oxidation. The tunneling oxide 310 can have, for example, a thickness ranging between about 2 nm to about 7 nm.

In an ensuing block 704, silicon nanocrystals are formed on the tunneling oxide 310. In one embodiment, the deposition may be performed using a LPCVD process. The substrate temperature can be kept at a temperature ranging between about 500° C. to about 750° C. A suitable silicon-based gas, such as, for example, $SiH_4$, can be introduced into the furnace. The time of the deposition can be selected based on the requirements of the dot size, and can be, for example, a time ranging between about 15 seconds to about 15 minutes. In one embodiment, the silicon nanocrystals have diameters ranging between about 3 nm to about 10 nm.

The method 700 continues at a block 706, in which a metal is deposited over the silicon nanocrystals. The metal can include, for example, cobalt, titanium, nickel, magnesium, chromium, molybdenum, tantalum, platinum, and tungsten. In one embodiment, the metal is deposited by e-beam deposition. In another embodiment, deposition occurs by sputtering. The metal layer can have a variety of thicknesses, such as, for example a thickness ranging between about 1 nm and about 30 nm.

In an ensuing block 710, an annealing process is performed. In one embodiment, the thermal process includes heating the substrate 302, tunneling oxide 310, silicon nanocrystals, and deposited metal to a temperature greater than or equal to about the silicide formation temperature of the selected metallic silicide. The heating can be performed for a period of time sufficient to form the metallic silicide. In this case, all Si nanocrystals are converted to silicide nanocrystals. For example, in a titanium silicide embodiment, the formation temperature can be a temperature ranging between about 700° C. to about 800° C., and the annealing time can have a duration ranging between about 1 minute to about 15 minutes. Additionally, in a cobalt silicide embodiment, the formation temperature can be a temperature ranging between about 300° C. to about 700° C., and the annealing time can be a time ranging between about 1 minute to about 15 minutes. Furthermore, in a nickel silicide embodiment, the formation temperature can be a temperature ranging between about 100° C. to 500° C., and the annealing time can have a duration ranging between about 1 minute to about 15 minutes.

The metal deposited on the silicon nanocrystals can form metallic silicide nanocrystals and/or Si nanocrystals coated with a metallic silicide. Silicide-coated Si nanocrystals are formed with shorter annealing time and/or lower annealing temperature. In this case, only surface portion of Si nanocrystals is converted to silicide. However, the metal directly deposited on the tunneling oxide does not form a silicide. An additional selective etching step can be performed to remove non-reacted metal between and on the metallic silicide nanocrystals.

The method 700 continues at a block 712, in which the control oxide 314 is deposited on the metallic silicide nanocrystals or silicide-coated Si nanocrystals. In one embodiment, the control oxide 314 is deposited by a low temperature oxide furnace. Subsequent MOSFET processing can be performed in block 714 to form the source, drain, gate, and other features of the memory device. The method 700 ends at 716.

Figure 8:
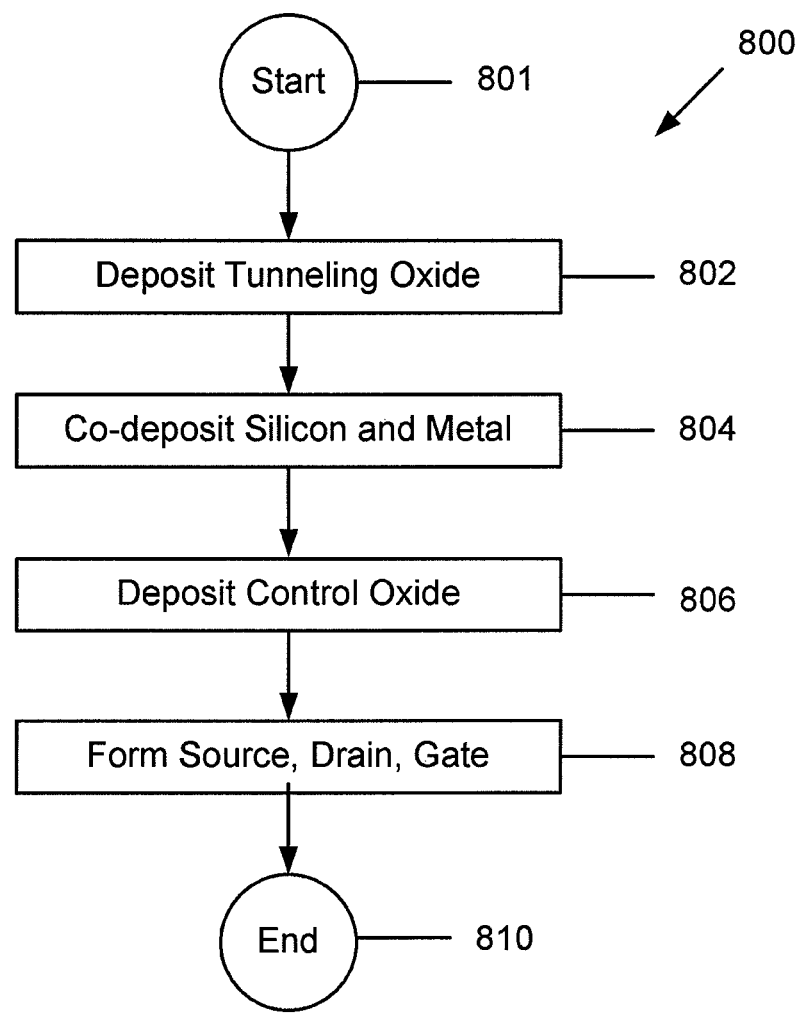
FIG. 8 is flow diagram of a method for forming a memory device in accordance with yet another embodiment.

FIG. 8 is a flow diagram of a method 800 for forming a memory device in accordance with yet another embodiment. It will be understood that the methods discussed herein may include greater or fewer operations and the operations may be performed in any order, as necessary. The illustrated method can be used to manufacture, for example, the memory device illustrated in FIG. 3.

The method 800 for fabricating metallic silicide nanocrystal memory devices starts at 901. In an ensuing block 802, the tunneling oxide 310 is formed upon a substrate 302. The details of this block can be similar to those described above with reference to FIG. 7.

In an ensuing block 804, silicon and metal is co-deposited on the substrate 302. This can be performed, for example, in a high vacuum chamber. The silicon source can be, for example, a silicon-based gas such as disilane or a solid source, such as silicon provided by e-beam evaporation or sputtering. The metal source can be, for example, effusion-cell type, e-beam evaporation type or sputtering target. The metallic silicide nanocrystals can be formed by co-deposition of Si and metal on the substrate at an elevated temperature sufficient to form a particular silicide or can be formed by co-deposition of Si and metal on the substrate at lower temperature, such as a temperature less than about 100° C., followed by subsequent annealing at a temperature sufficient to form a particular silicide. Suitable metals and annealing temperature ranges can be similar to those described above with reference to FIG. 7.

The method 800 continues at a block 806, in which the control oxide 314 is deposited on the metallic silicide nanocrystals. In an ensuing block 808, in which the source, drain, gate, and other features of the memory device are formed. The details of blocks 806 and 808 can be similar to that described above with reference to FIG. 7. The method 800 ends at 810.

Embodiments of the present disclosure present nanocrystal memory devices. The devices can include silicide/silicon hetero-nanocrystals and metallic silicide nanocrystals formed by vapor-liquid-solid or vapor-solid-solid growth mechanisms or pure silicide nanocrystals and silicide-coated Si nanocrystals by self-aligned silicidation annealing technique as floating gates.

Although the foregoing description has shown, described, and pointed out the fundamental novel features of the present teachings, it will be understood that various omissions, substitutions, and changes in the form of the detail of the apparatus as illustrated, as well as the uses thereof, may be made by those skilled in the art, without departing from the scope of the present teachings.

What is claimed is:

1. A method of forming a memory device, comprising:
   depositing an oxide layer on a substrate;
   forming silicide nanocrystals on the oxide layer; and
   forming a control oxide over the silicide nanocrystals,
      wherein forming silicide nanocrystals on the oxide layer comprises depositing metal nanodots on the oxide layer, providing a source of silicon to the metal nanodots, and absorbing at least a portion of the silicon from the silicon source into the metal nanodots to form silicide nanodots through vapor-liquid-solid or vapor-solid-solid growth.

2. The method of claim 1, wherein the source of silicon comprises silane ($SiH_4$), disilane ($Si_2H_6$), or $SiH_2Cl_2$.

3. The method of claim 1, wherein the metal nanodots comprise at least one of titanium, nickel, platinum, cobalt, manganese, chromium, molybdenum, tantalum, and tungsten.

4. The method of claim 1, wherein the silicide nanodots have diameters ranging between about 2 nm to about 10 nm.

5. The method of claim 1, wherein depositing metal nanodots comprises e-beam evaporation of the metal at a temperature ranging between about 100° C. to about 750° C.

6. The method of claim 1, wherein depositing metal nanodots comprises:
   depositing a catalyst metal film on the oxide layer at a temperature less than about 100° C.; and
   annealing the catalyst metal at a temperature ranging between about 100° C. to about 750° C.

7. The method of claim 1, wherein depositing metal nanodots comprises:
   depositing a layer of metal having a thickness ranging between about 0.2 nm to about 2 nm on the oxide layer;
   annealing the layer of metal at a temperature ranging between about 100° C. to about 750° C.

8. The method of claim 1, further comprising forming hetero-nanocrystals from the silicide nanocrystals.

9. The method of claim 8, wherein forming hetero-nanocrystals from the silicide nanocrystals comprises providing a source of silicon to the silicide nanocrystals and absorbing at least a portion of the silicon from the silicon source into the silicide nanocrystals.

* * * * *

UNITED STATES PATENT AND TRADEMARK OFFICE
CERTIFICATE OF CORRECTION

PATENT NO.        : 8,481,386 B2                                      Page 1 of 1
APPLICATION NO.   : 12/757812
DATED             : July 9, 2013
INVENTOR(S)       : Jianlin Liu et al.

It is certified that error appears in the above-identified patent and that said Letters Patent is hereby corrected as shown below:

On the Title Page

On Page 1, (Item 56), Column 2, Line 2, Under Other Publications, change "memroy" to --memory--.

On Page 2, (Item 56), Column 1, Line 36, Under Other Publications, change "nanolavers" to --nanolayers--.

On Page 2, (Item 56), Column 2, Line 17, Under Other Publications, change "Nanocwstals" to --Nanocrystals--.

On Page 2, (Item 56), Column 2, Line 64, Under Other Publications, change "graphic" to --graphitic--.

On Page 3, (Item 56), Column 2, Line 4, Under Other Publications, change "Fabricatioin" to --Fabrication--.

In the Specification

In Column 1, Line 17, change "Hr" to --HR--.

In Column 4, Line 48, change "the." to --the--.

In the Claims

In Column 9, Line 22, Claim 2, change "Cl$_2$" to --Cl$_2$--.

Signed and Sealed this
Twenty-second Day of April, 2014

Michelle K. Lee
*Deputy Director of the United States Patent and Trademark Office*